United States Patent
Cheng et al.

(10) Patent No.: US 8,884,344 B2
(45) Date of Patent: Nov. 11, 2014

(54) SELF-ALIGNED CONTACTS FOR REPLACEMENT METAL GATE TRANSISTORS

(71) Applicant: International Business Machines Corporation, Armonk, NY (US)

(72) Inventors: Kangguo Cheng, Schenectady, NY (US); Ali Khakifirooz, Mountain View, CA (US); Alexander Reznicek, Troy, NY (US); Raghavasimhan Sreenivasan, Schenectady, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/789,792

(22) Filed: Mar. 8, 2013

(65) Prior Publication Data
US 2014/0252427 A1    Sep. 11, 2014

(51) Int. Cl.
*H01L 29/76* (2006.01)
*H01L 21/768* (2006.01)
*H01L 29/51* (2006.01)

(52) U.S. Cl.
CPC .... *H01L 21/76829* (2013.01); *H01L 21/76879* (2013.01); *H01L 29/51* (2013.01)
USPC ........... 257/288; 257/368; 257/306; 257/410; 257/369; 438/595; 438/230; 438/300; 438/586; 438/197

(58) Field of Classification Search
USPC .......... 257/288, 368, 306, 410, 369; 438/595, 438/230, 300, 586, 197
See application file for complete search history.

(56) References Cited

U.S. PATENT DOCUMENTS

| | | | |
|---|---|---|---|
| 6,531,724 B1 | 3/2003 | Furukawa et al. | |
| 7,078,282 B2 | 7/2006 | Chau et al. | |
| 7,157,777 B2 | 1/2007 | Tsuchiaki et al. | |
| 7,544,594 B2 | 6/2009 | Change | |
| 7,544,610 B2 | 6/2009 | Cabral, Jr. et al. | |
| 7,781,282 B2 | 8/2010 | Yoo et al. | |
| 7,867,863 B2 | 1/2011 | Chang | |
| 8,084,311 B1 | 12/2011 | Horak et al. | |
| 8,524,592 B1 * | 9/2013 | Xie et al. | 438/595 |

(Continued)

OTHER PUBLICATIONS

Kelin J. Kuhn, "CMOS Transistor Scaling Past 32 nm and Implications on Variation", 2010 IEEE/SEMI Advanced Semiconductor Manufacturing Conference (ASMC), Jul. 11-13, 2010, pp. 241-246.

*Primary Examiner* — Fernando L Toledo
*Assistant Examiner* — Mohammed Shamsuzzaman
(74) *Attorney, Agent, or Firm* — Joseph Petrokaitis; Jinesh P. Patel

(57) ABSTRACT

Embodiments of the invention include methods of forming gate caps. Embodiments may include providing a semiconductor device including a gate on a semiconductor substrate and a source/drain region on the semiconductor substrate adjacent to the gate, forming a blocking region, a top surface of which extends above a top surface of the gate, depositing an insulating layer above the semiconductor device, and planarizing the insulating layer using the blocking region as a planarization stop. Embodiments further include semiconductor devices having a semiconductor substrate, a gate above the semiconductor substrate, a source/drain region adjacent to the gate, a gate cap above the gate that cover the full width of the gate, and a contact adjacent to the source/drain region having a portion of its sidewall defined by the gate cap.

13 Claims, 5 Drawing Sheets

(56) References Cited

U.S. PATENT DOCUMENTS

| | | |
|---|---|---|
| 2011/0156107 A1 | 6/2011 | Bohr et al. |
| 2011/0298017 A1* | 12/2011 | Jain et al. ............... 257/288 |
| 2012/0018816 A1 | 1/2012 | Sen et al. |
| 2013/0075821 A1* | 3/2013 | Baars et al. ............... 257/368 |
| 2013/0181265 A1* | 7/2013 | Grasshoff et al. ......... 257/288 |
| 2013/0234261 A1* | 9/2013 | Wei et al. ................. 257/408 |
| 2013/0277752 A1* | 10/2013 | Glass et al. ............... 257/369 |
| 2013/0295740 A1* | 11/2013 | Donegan et al. .......... 438/285 |

* cited by examiner

US 8,884,344 B2

SELF-ALIGNED CONTACTS FOR REPLACEMENT METAL GATE TRANSISTORS

BACKGROUND

The present invention relates generally to the fabrication of semiconductor devices, and more specifically to forming self-aligned contacts to the field-effect transistors (FETs) having replacement metal gates.

FETs are commonly employed in electronic circuit applications. FETs may include a semiconductor substrate containing a source region and a drain region spaced apart by a channel region. A gate, potentially including a gate dielectric layer, a work function metal layer, and a metal electrode, may be formed above the channel region. In part to protect the gate, insulating spacers may be formed on the side of the gate. By applying voltage to the gate, the conductivity of the channel region may increase and allow current to flow from the source region to the drain region.

Due in part to the relative instability of the dielectric layer and work function metal layer of the gate, a gate-last process may be used where a sacrificial gate is formed prior to forming other components of the FET. The sacrificial gate may then be removed to form a recessed region that may then be filled with a replacement metal gate (RMG) potentially including a gate dielectric layer, a work function metal layer, and a metal electrode. Because the RMG is formed after the other components of the FET, it is not subjected to various potentially damaging processing steps, for example high-temperature anneals.

To allow current to flow to and from the source and the drain region, respectively, electrical contacts may be formed on the source region and the drain region. The contacts may be formed by etching contact holes in the dielectric layer. As transistor structures continue to become smaller in size, it becomes increasingly difficult to lithographically define the borders of the contact holes. As a result, techniques have been developed to use the insulating spacers to form borderless, self-aligned contacts (SAC). Borderless contacts may be formed so that there is no remaining material of the dielectric layer between the contact and the spacers. By using the spacers to define the contact, it may be possible to maximize the interface between the contact and the source/drain region while also utilizing a less precise lithographic process.

However, in order to incorporate both a RMG and a SAC into a FET, it may be necessary to protect the RMG with an insulating cap to prevent short-circuiting between the RMG and the SAC. In some cases, this may be accomplished by recessing the RMG after its formation and depositing an insulating layer in the recessed region. However, the process to recess the RMG may, among other issues, be unreliable and/or cause damage to the work-function metal. Therefore, a process for forming a SAC to a FET with a RMG that does not require recessing the RMG is desirable.

BRIEF SUMMARY

The present invention relates to methods of forming gate caps above replacement metal gates (RMGs) of field-effect transistors (FETs) prior to forming self-aligned contacts to the source/drain regions of the FETs. According to an exemplary embodiment, the method may include providing a semiconductor device including a gate on a semiconductor substrate and a source/drain region on the semiconductor substrate adjacent to the gate, forming a blocking region above the source/drain region extending above a top surface of the gate, depositing an insulating layer above the gate, and planarizing the insulating layer using the blocking region as a planarization stop.

According to another embodiment, a self-aligned contact may be formed by providing a semiconductor device including a gate on a semiconductor substrate and a source/drain region on the semiconductor substrate adjacent to the gate, forming a blocking region above the source/drain region, where a top surface of the blocking region extends above a top surface of the gate, depositing an insulating layer above the gate, and planarizing the insulating layer using the blocking region as a planarization stop, removing the blocking region, depositing an interlevel dielectric layer above the semiconductor device, forming a contact hole in the interlevel dielectric, and forming a contact in the contact hole. The contact hole may expose a portion of the source/drain region and a portion of a sidewall of the contact hole may be defined by the gate cap.

According to another embodiment, a semiconductor device may include a semiconductor substrate, a gate above the semiconductor substrate, a source/drain region adjacent to the gate, a gate cap above the gate covering the full width of the gate, and a contact adjacent to the source/drain region. A portion of a sidewall of the contact may be defined by the gate cap.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which.

Figure 1:
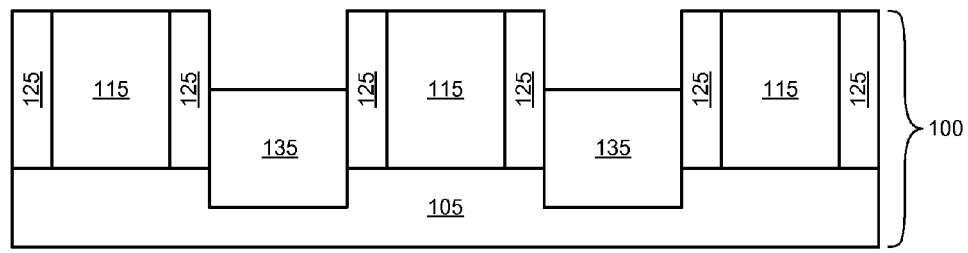
FIG. 1 is a cross-sectional front elevational view of semiconductor device including a plurality of field effect transistors (FETs), according to an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Referring to FIG. 1, a semiconductor device 100 may be formed by any methods known in the art and include a substrate 105, sacrificial gates 115 above the substrate 105, spacers 125 on sidewalls of the sacrificial gates 115, and source/drain regions 135 adjacent to the sacrificial gates 115. The semiconductor device 100 may include any number of individual transistors. While the semiconductor device 100 depicted in FIG. 1 includes planar transistors, it will be understood by a person of ordinary skill in the art that the processes described in conjunction with FIGS. 1-12 are equally applicable to other types of transistors, including, for example, finFETs.

The substrate 105 may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the substrate 105 may be about, but is not limited to, several hundred microns thick. For example, the substrate 105 may include a thickness ranging from approximately 0.5 mm to approximately 1.5 mm. Some embodiments may include means of isolating structures formed on the substrate 105. For example, in some embodiments, the substrate 105 may be a semiconductor-on-insulator (SOI) substrate (not shown), including a handle substrate, a buried insulator layer, and a top insulator layer, or include shallow trench isolation (STI) regions (not shown) to electrically separate adjacent devices.

The sacrificial gates 115 may be formed using any method known in the art, including for example, depositing a sacrificial layer (not shown) made of, for example, polysilicon, above the substrate 105 and selectively etching the sacrificial layer to remove unwanted material. The sacrificial gates 115 may have a vertical height of approximately 30 nm to approximately 100 nm and a horizontal width of approximately 15 nm to approximately 100 nm, although greater or lesser heights and widths are also contemplated.

The spacers 125 may be made of materials including, but not limited to, silicon nitride, silicon oxide, and silicon carbide, and may have a horizontal thickness of approximately 2 nm to approximately 100 nm, preferably approximately 2 nm to approximately 50 nm. The spacers 125 may be formed, for example, by depositing an insulating layer over the sacrificial gates 115 using known deposition techniques including, for example, chemical vapor deposition (CVD) and atomic layer deposition (ALD) and then removing excess material using an anisotropic etching process, such as reactive ion etching (RIE) or plasma etching (not shown).

Source/drain regions 135 may be semiconductor regions formed in the substrate 105 by any method known in the art. For example, as in the depicted embodiment, the source/drain regions 135 may be raised source/drains (RSDs) formed by etching recess regions in the substrate 105 and then filling the recess regions with semiconductor material, such as silicon, silicon-germanium, or silicon-carbon, using known deposition or growth methods. The source/drain regions 135 may have a width of approximately 10 nm to approximately 50 nm. In other embodiments, the source/drain regions 135 may be formed, for example, by doping the substrate 105 using ion implantation (not shown) or by merging multiple semiconductor fins by growing semiconductor material on the fins (not shown).

Figure 2:
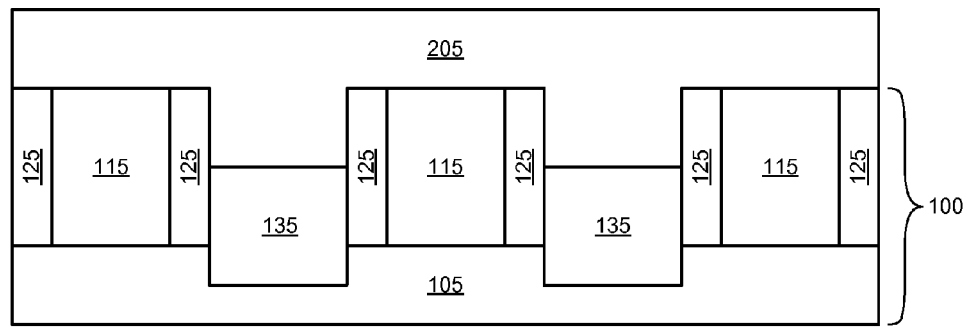
FIG. 2 is a cross-sectional front elevational view depicting depositing a first insulating layer above the semiconductor device shown in FIG. 1, according to an embodiment of the present invention.

Referring to FIG. 2, a sacrificial insulating layer 205 may be deposited above the semiconductor device 100 (FIG. 1). The sacrificial insulating layer 205 may be thick enough to fully cover the semiconductor device 100 and may be made of a material having good etch selectivity relative to the sacrificial gates 115, so that the sacrificial gates 115 may be removed in subsequent processes without substantially removing material from the sacrificial insulating layer 205. The sacrificial insulating layer 205 may have a thickness of approximately 5 nm to approximately 30 nm. In one embodiment where the sacrificial gates 115 are made of silicon, the sacrificial insulating layer 205 may be made of silicon oxide. Other potential materials for the sacrificial insulating layer 205 include, for example, silicon nitride, silicon oxynitride, and silicon carbide. The sacrificial insulating layer 205 may be formed using any known deposition process including, for example, chemical vapor deposition (CVD), physical vapor deposition (PVD), and atomic layer deposition (ALD).

Figure 3:
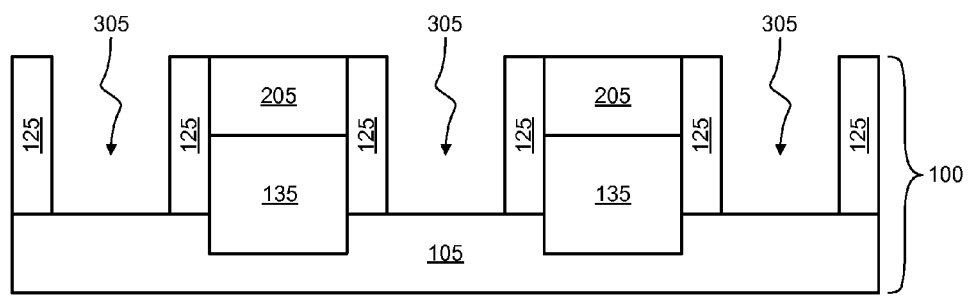
FIG. 3 is a cross-sectional front elevational view depicting removing the sacrificial gates of the semiconductor device shown in FIG. 2, according to an embodiment of the present invention.

Referring to FIG. 3, the sacrificial insulating layer 205 may be planarized to expose the sacrificial gates 115 (FIG. 2), and the sacrificial gates 115 may be removed to form gate recess regions 305. The sacrificial insulating layer 205 may be planarized using, for example, chemical-mechanical planarization (CMP) using the sacrificial gates 115 as an etch-stop. the sacrificial gates 115 may be removed by any suitable etching process known in the art capable of selectively removing the sacrificial gates 115 without substantially removing material from the spacers 125 or the sacrificial insulating layer 205, including, for example, a reactive ion etching (RIE) process capable of selectively removing silicon or a hydrofluoric acid-containing wet etch.

Figure 4:
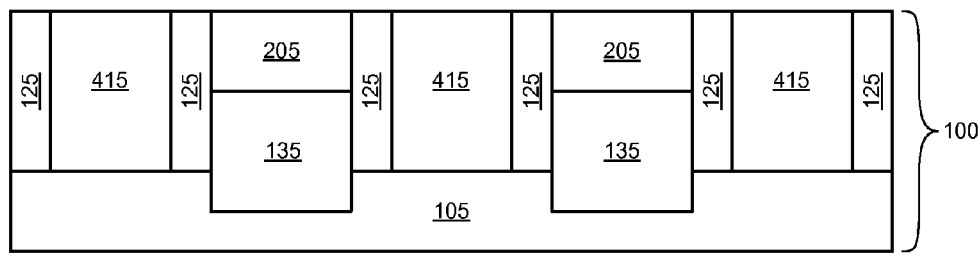
FIG. 4 is a cross-sectional front elevational view depicting forming replacement metal gates in the gate recesses of the semiconductor device shown in FIG. 3, according to an embodiment of the present invention.

Referring to FIG. 4, replacement metal gates (RMGs) 415 may be formed in the gate recess regions 305. Each of the RMGs 415 may include, for example, one or more gate dielectric layers (not shown), one or more work-function metal layers (not shown), and a gate electrode (not shown), and may be formed using known deposition techniques, including, for example, CVD, PVD, ALD, or other known techniques, including epitaxial growth processes. Exemplary gate dielectric layers include silicon oxide$_2$, hafnium oxide, zirconium oxide, aluminum oxide, titanium oxide, lanthanum oxide, strontium titanium oxide, lanthanum aluminum oxide, and mixtures thereof. Exemplary work function metals include, for example, aluminum, lanthanum oxide, magnesium oxide, strontium titanate, and strontium oxide. The gate electrode layer may be made of gate conductor materials including, but not limited to, zirconium, tungsten, tantalum, hafnium, titanium, aluminum, ruthenium, metal oxides, metal carbides, metal nitrides, transition metal aluminides, tantalum carbide, titanium carbide, tantalum magnesium carbide, or combinations thereof. The gate electrode layer may further include one or more low resistance gate capping layers such as titanium nitride, tungsten, titanium, aluminum, tantalum, tantalum nitride, cobalt, titanium carbide, tantalum carbide, nickel, or combinations thereof.

Figure 5:
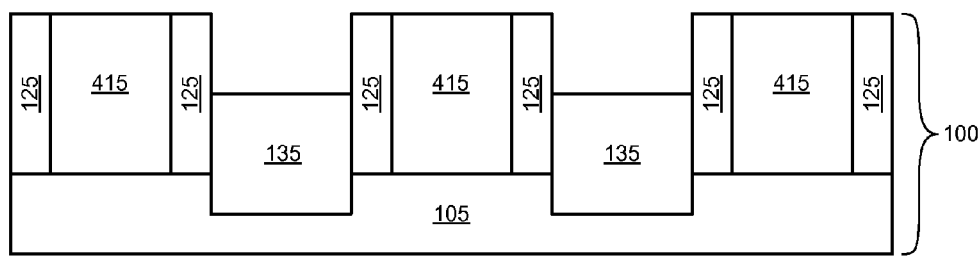
FIG. 5 is a cross-sectional front elevational view depicting removing the first insulating layer from above the semiconductor device shown in FIG. 4, according to an embodiment of the present invention.

Referring to FIG. 5, the sacrificial insulating layer 205 may be removed to expose source/drain regions 135. The sacrificial insulating layer 205 may be removed by any suitable etching process known in the art capable of selectively removing the sacrificial insulating layer 205 without substantially removing material from the RMGs 415, the spacers 125, and the source/drain regions 135. In embodiments where the sacrificial insulating layer is made of silicon oxide, exemplary suitable etching processes include a wet etch using hydrofluoric acid and chemical dry etching.

Figure 6:
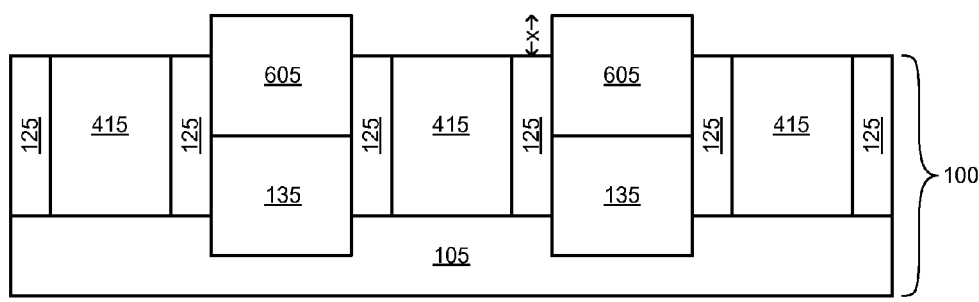
FIG. 6 is a cross-sectional front elevational view depicting growing blocking regions above the source/drain regions of the semiconductor device shown in FIG. 5, according to an embodiment of the present invention.

Referring to FIG. 6, blocking regions 605 may be formed above the source/drain regions 135. To form adequate capping layers above the RMGs 415, as described below in FIGS. 7-8, the blocking regions 605 may extend above the top surface of the RMGs 415 by a height x of approximately 5 nm to approximately 50 nm, preferably approximately 10 nm to approximately 30 nm. The blocking regions 605 may be made of any material able to be formed above the source/drain regions 135 while also having good etch selectivity with the source/drain regions 135. In an exemplary embodiment, the blocking regions 605 may be formed by growing epitaxial germanium on the source/drain regions 135.

Figure 7:
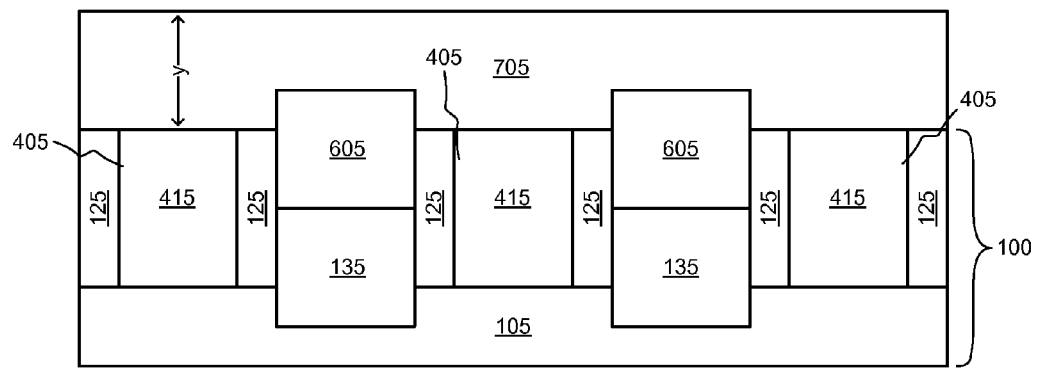
FIG. 7 is a cross-sectional front elevational view depicting depositing a capping layer above the semiconductor device shown in FIG. 6, according to an embodiment of the present invention.

Referring to FIG. 7, a capping layer 705 may be deposited above the semiconductor device 100. The capping layer 705 may have a thickness sufficient to fully cover the RMGs 415 and the blocking regions 605. In one embodiment, the capping layer 705 may have a thickness y of approximately 30 nm to approximately 150 nm, preferably approximately 50 nm to approximately 100 nm. The capping layer 705 may be made of a material having good etch selectivity with the blocking regions 605 and the ILD layer subsequently formed as described in conjunction with FIG. 10. In one embodiment, the capping layer 705 may be made of the same material as the spacers 125, such as, for example, silicon nitride, silicon oxide, or silicon carbide.

Figure 8:
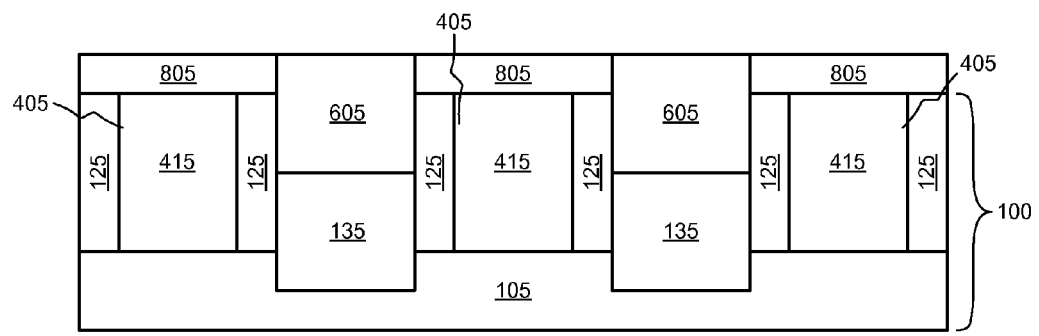
FIG. 8 is a cross-sectional front elevational view depicting planarizing the capping layer above the semiconductor device shown in FIG. 7, according to an embodiment of the present invention.

Referring to FIG. 8, the capping layer 705 (FIG. 7) may be planarized using the blocking regions 605 as a planarization-stop to form gate caps 805 above the RMGs 415. The capping layer 705 may be planarized by any known process including, for example, CMP. After planarization, the thickness of the gate caps 805 may be approximately equal the height x by which the blocking regions 605 extend above the top surface of the RMGs 415, approximately 5 nm to approximately 50 nm, preferably approximately 10 nm to approximately 30 nm.

Figure 9:
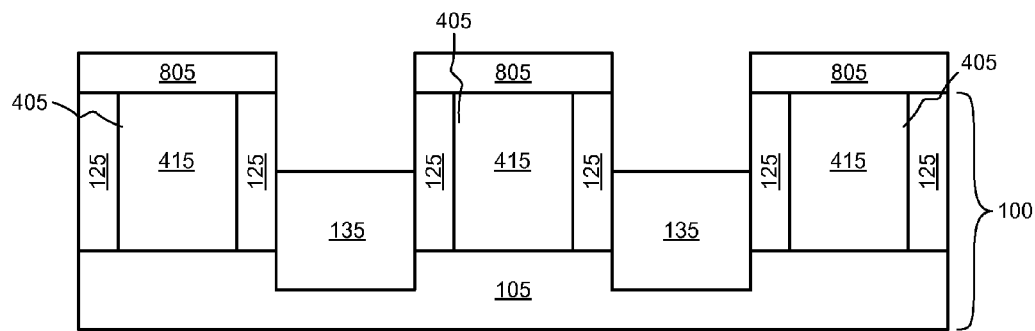
FIG. 9 is a cross-sectional front elevational view depicting removing the blocking regions from above the source/drain regions of the semiconductor device shown in FIG. 8, according to an embodiment of the present invention.

Referring to FIG. 9, the blocking regions 605 may be selectively removed from above the source/drain regions 135. The blocking regions 605 may be removed by any suitable etching process known in the art capable of selectively removing the blocking regions 605 without substantially removing material from the spacers 125, and the gate caps 805. In an exemplary embodiment where the blocking regions 605 are made of germanium, exemplary suitable etching process may include a wet etch using hydrogen peroxide and a gas phase etch using hydrochloric acid.

Figure 10:
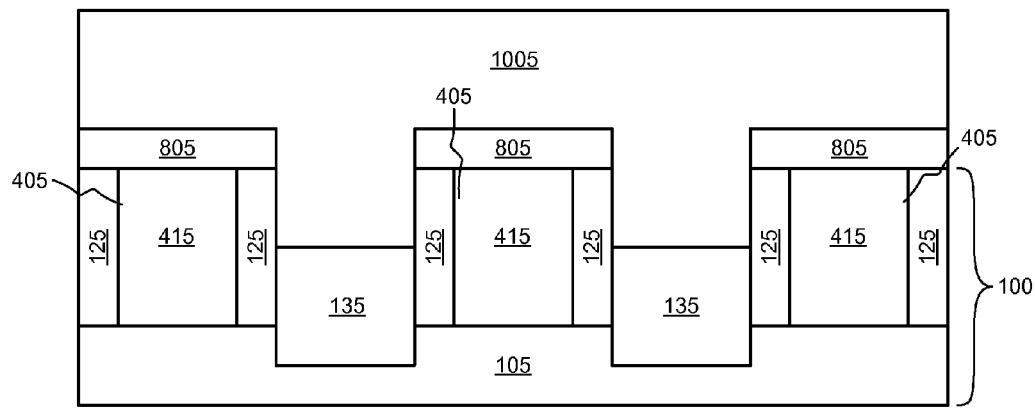
FIG. 10 is a cross-sectional front elevational view depicting depositing a second insulating layer above the semiconductor device shown in FIG. 9, according to an embodiment of the present invention.

Referring to FIG. 10, an interlevel dielectric (ILD) layer 1005 may be deposited above the semiconductor device 100 so that the ILD layer 1005 covers the source/drain regions 135 and the gate caps 805. The ILD layer 1005 may be formed by depositing, using any known technique, including chemical vapor deposition and physical vapor deposition, an insulating layer above the semiconductor device 100, and then planarizing the deposited layer using, for example, CMP to create a substantially planar top surface. The ILD layer 1005 may be made of, for example, oxides, nitrides, oxynitrides, or some combination thereof, and may have a thickness of approximately 5 nm to approximately 200 nm. In some embodiments, the ILD layer 1005 may consist of more than one layer and may further include, for example, a stress liner (not shown) between the insulating layer and the semiconductor device 100.

Figure 11:
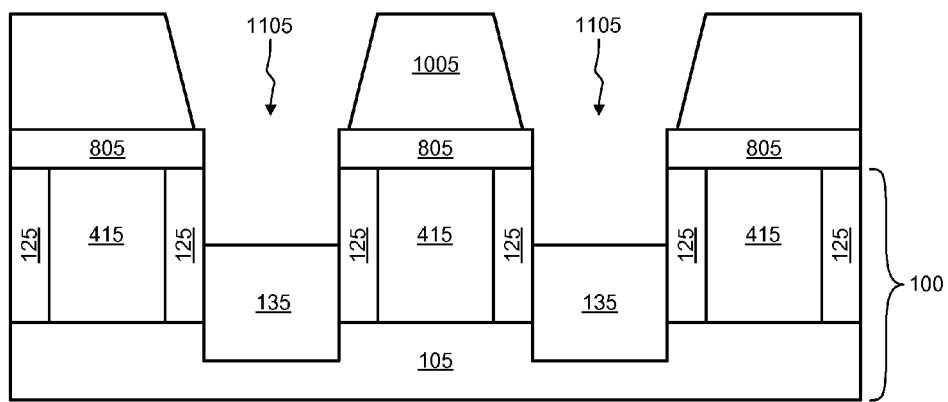
FIG. 11 is a cross-sectional front elevational view depicting forming contact holes in the second insulating layer shown in FIG. 10, according to an embodiment of the present invention.

Referring to FIG. 11, contact holes 1105 exposing the source/drain regions 135 may be formed by etching the ILD layer 1005. The ILD layer 1005 may be etched using a known anisotropic etching process such as RIE or plasma etching capable of selectively etching the ILD layer 1005 without substantially removing material from the gate caps 805, the spacers 125, and the source/drain regions 135. Some amount of etching of the gate caps 805 and the spacers 125 may be acceptable as long as the RMGs 415 are not exposed.

Figure 12:
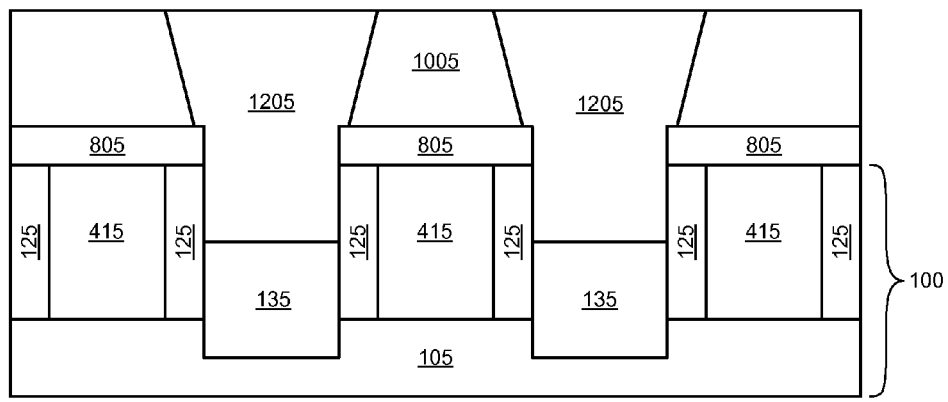
FIG. 12 is a cross-sectional front elevational view depicting forming contacts in the contact holes shown in FIG. 11, according to an embodiment of the present invention.

Referring to FIG. 12, contacts 1205 may be formed by any known method in the art, including for example filling the contact holes 1105 (FIG. 11) with a conductive liner and a conductive fill (not shown). The conductive liner may be made of, for example, titanium, tantalum, nickel, platinum, palladium, erbium, ytterbium, or some combination thereof and formed using known metal deposition techniques including, but not limited to, chemical vapor deposition (CVD), physical vapor deposition (PVD) and atomic layer deposition (ALD). The conductive fill may include, for example, tungsten, copper, aluminum, silver, gold, alloys thereof, and any suitable combination thereof, and may be deposited by any suitable technique, including but not limited to, for example, atomic layer deposition (ALD), molecular layer deposition (MLD), chemical vapor deposition (CVD), in-situ radical assisted deposition, metal-organic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof.

Because the ILD layer 1005 may be etched selectively from the gate caps 805 and the spacers 125 when forming the contact holes 1105, the gate caps 805 and the spacers 125 may define a portion of the boundaries of the contact holes 1105. This may allow the contact 1205 to be formed close to the RMGs 415 using a self-aligned process that does not require a highly precise lithographic process while also reducing the risk of shorting between the RMGs 415 and the contacts 1205.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a gate cap, the method comprising:
   providing a semiconductor device comprising a gate on a semiconductor substrate and a source/drain region on the semiconductor substrate adjacent to the gate;
   forming a blocking region above the source/drain region by growing epitaxial germanium on the source/drain region, wherein a top surface of the blocking region extends above a top surface of the gate;
   depositing an insulating layer above the semiconductor device; and
   planarizing the insulating layer using the blocking region as a planarization stop.

2. The method of claim 1, wherein the semiconductor device is formed using a replacement metal gate process.

3. The method of claim 1, wherein the top surface of the blocking region extends above the top surface of the gate by approximately 5 nm to approximately 50 nm.

4. The method of claim 1, wherein the top surface of the blocking region extends above the top surface of the gate by approximately 10 nm to approximately 30 nm.

5. The method of claim 1, wherein depositing the insulating layer above the semiconductor device comprises depositing a nitride layer.

6. The method of claim 1, wherein the semiconductor device further comprises spacers on sidewalls of the gate between the gate and the source/drain region and the spacers are made of the same material as the insulating layer.

7. A method of forming a self-aligned contact hole, the method comprising:
   providing a semiconductor device comprising a gate on a semiconductor substrate and a source/drain region on the semiconductor substrate adjacent to the gate;
   forming a blocking region above the source/drain region by growing epitaxial germanium on the source/drain region, wherein a top surface of the blocking region extends above a top surface of the gate;
   forming a gate cap above the gate, wherein forming the gate cap comprises depositing an insulating layer above the gate and planarizing the insulating layer using the blocking region as a planarization stop;
   removing the blocking region; and
   depositing an interlevel dielectric layer above the semiconductor device;
   forming a contact hole in the interlevel dielectric layer, wherein the contact hole exposes a portion of the source/drain region and wherein a portion of a sidewall of the contact hole is defined by the gate cap.

8. The method of claim 7, wherein the semiconductor device is formed using a replacement metal gate process.

9. The method of claim 7, wherein the top surface of the blocking region extends above the top surface of the gate by approximately 5 nm to approximately 50 nm.

10. The method of claim 7, wherein the top surface of the blocking region extends above the top surface of the gate by approximately 10 nm to approximately 30 nm.

11. The method of claim 7, wherein depositing the insulating layer above the semiconductor device comprises depositing a nitride layer.

12. The method of claim 7, further comprising a metal contact in the contact hole.

13. The method of claim 7, wherein the semiconductor device further comprises spacers on sidewalls of the gate between the gate and the source/drain region and the spacers are made of the same material as the gate cap.

* * * * *